United States Patent
Peh

(10) Patent No.: US 12,483,251 B2
(45) Date of Patent: Nov. 25, 2025

(54) FEEDBACK DIVIDER IN A PLL USED AS A PHASE/FREQUENCY DETECTOR

(71) Applicant: Silicon Laboratories Inc., Austin, TX (US)

(72) Inventor: Sheng Jue Peh, Singapore (SG)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 18/592,910

(22) Filed: Mar. 1, 2024

(65) Prior Publication Data

US 2025/0279782 A1    Sep. 4, 2025

(51) Int. Cl.
*H03L 7/099* (2006.01)
*H03L 7/083* (2006.01)
*H03L 7/093* (2006.01)

(52) U.S. Cl.
CPC ............ *H03L 7/0992* (2013.01); *H03L 7/083* (2013.01); *H03L 7/093* (2013.01)

(58) Field of Classification Search
CPC ......... H03L 7/099; H03L 7/087; H03L 7/089; H03L 7/18; H03L 7/16; H03L 2207/50; H03L 7/1803; H03L 7/181; H03L 7/183; H03L 7/193; H03L 7/195; H03L 7/197; H03L 7/1972; H03L 7/1974; H03L 7/199
See application file for complete search history.

(56) References Cited

U.S. PATENT DOCUMENTS 8,971,455 B2 * 3/2015 Ganesan ............... H03L 7/1803
                                                    375/376
10,763,869 B2    9/2020 Khoury

OTHER PUBLICATIONS

Hussein, A., et al., "A 50-66 GHz Phase-Domain Digital Frequency Synthesizer with Low Phase Noise and Low Fractional Spurs," IEEE Journal of Solid-State Circuits, vol. 52, No. 12, Sep. 27, 2017, 19 pages.
Perrott, M., "Tutorial on Digital Phase-Locked Loops CICC 2009," Custom Integrated Circuits Conference, Sep. 2009, 118 pages downloaded from https://www.cppsim.com/PLL_Lectures/digital_pll_cicc_tutorial_perrott.pdf on Jan. 3, 2024.

(Continued)

*Primary Examiner* — Diana J. Cheng
(74) *Attorney, Agent, or Firm* — Zagorin Cave LLP

(57) ABSTRACT

A phase-locked loop (PLL) uses a feedback divider to provide phase and frequency information for faster lock. The PLL includes a time to digital converter that generates first phase information indicative of a phase difference between a reference clock and a feedback clock. A digital filter receives the first phase information and generates an oscillator control signal used by an oscillator to generate an oscillator output. A feedback divider uses a ripple counter to divide the oscillator output to generate the feedback clock. One sample of the ripple counter provides second phase information and two samples of the ripple counter provide frequency information, which are used to generate the oscillator control signal. The one sample of the ripple counter is compared to an expected value when the PLL is locked to generate second phase information and a difference between the two samples is used to generate the frequency information.

20 Claims, 5 Drawing Sheets

(56) References Cited

OTHER PUBLICATIONS

Staszewski, R., et al., "Digitally Controlled Oscillator (DCO)-Based Architecture for RF Frequency Synthesis in a Deep-Submicrometer CMOS Process," IEEE Transactions on Circuits and Systems—II: Analog and Digital Signal Processing, vol. 50, No. 11, Nov. 2003, pp. 815-828.
Staszewski, R., et al., "All-Digital PLL and Transmitter for Mobile Phones," IEEE Journal of Solid-State Circuits, vol. 40, No. 12, Dec. 2005, pp. 2469-2482.
Staszewski, R., "Digital Deep-Submicron CMOS Frequency Synthesis for RF Wireless Applications," Dissertation, University of Texas at Dallas, Aug. 2002, 319 pages.
Texas Instruments, "AN-1879 Fractional N Frequency Synthesis," SNAA062B, Apr. 2013, revised Nov. 2021 downloaded from https://www.ti.com/lit/pdf/snaa062 on Jan. 31, 2024, 28 pages.

\* cited by examiner

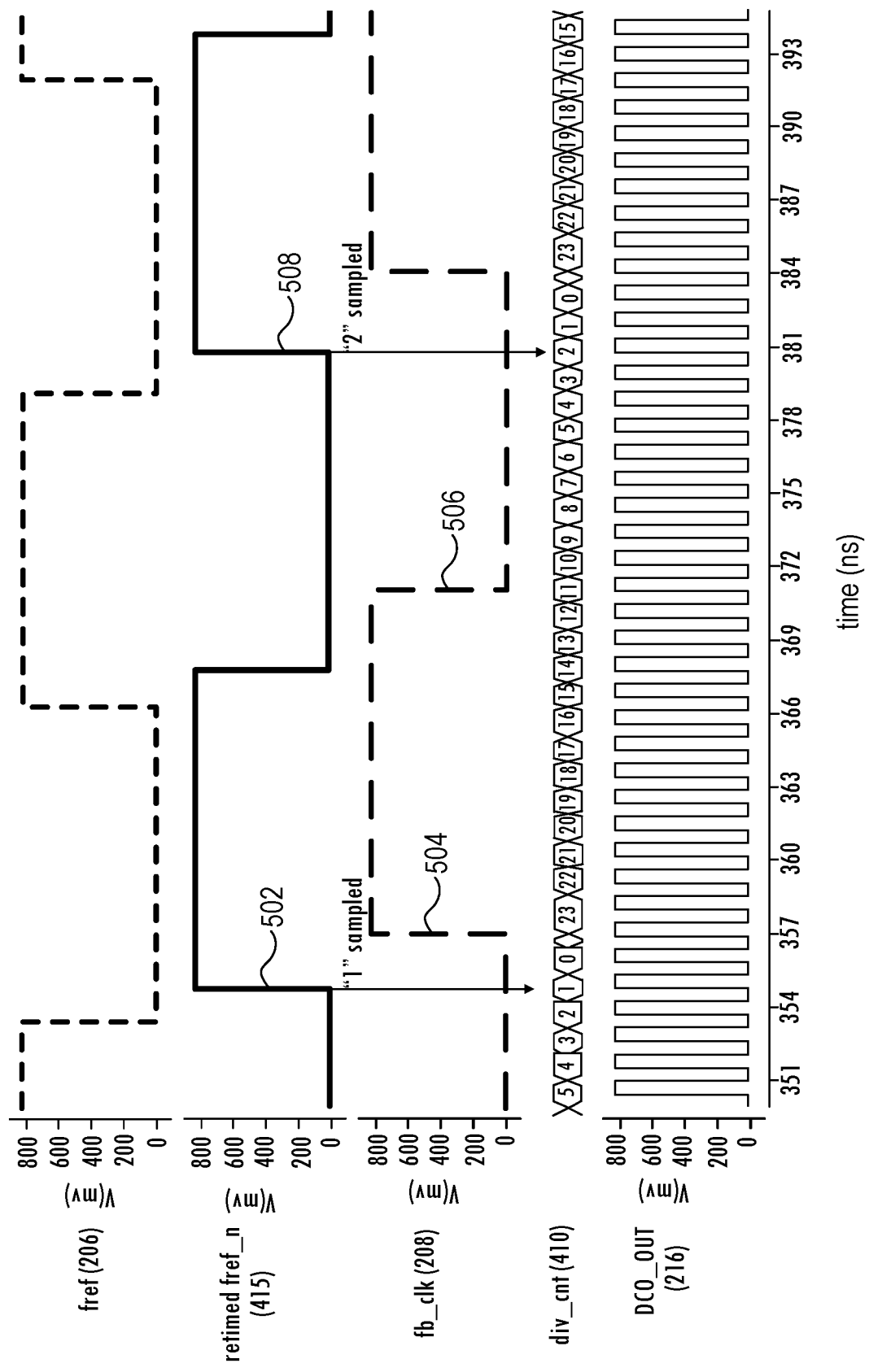

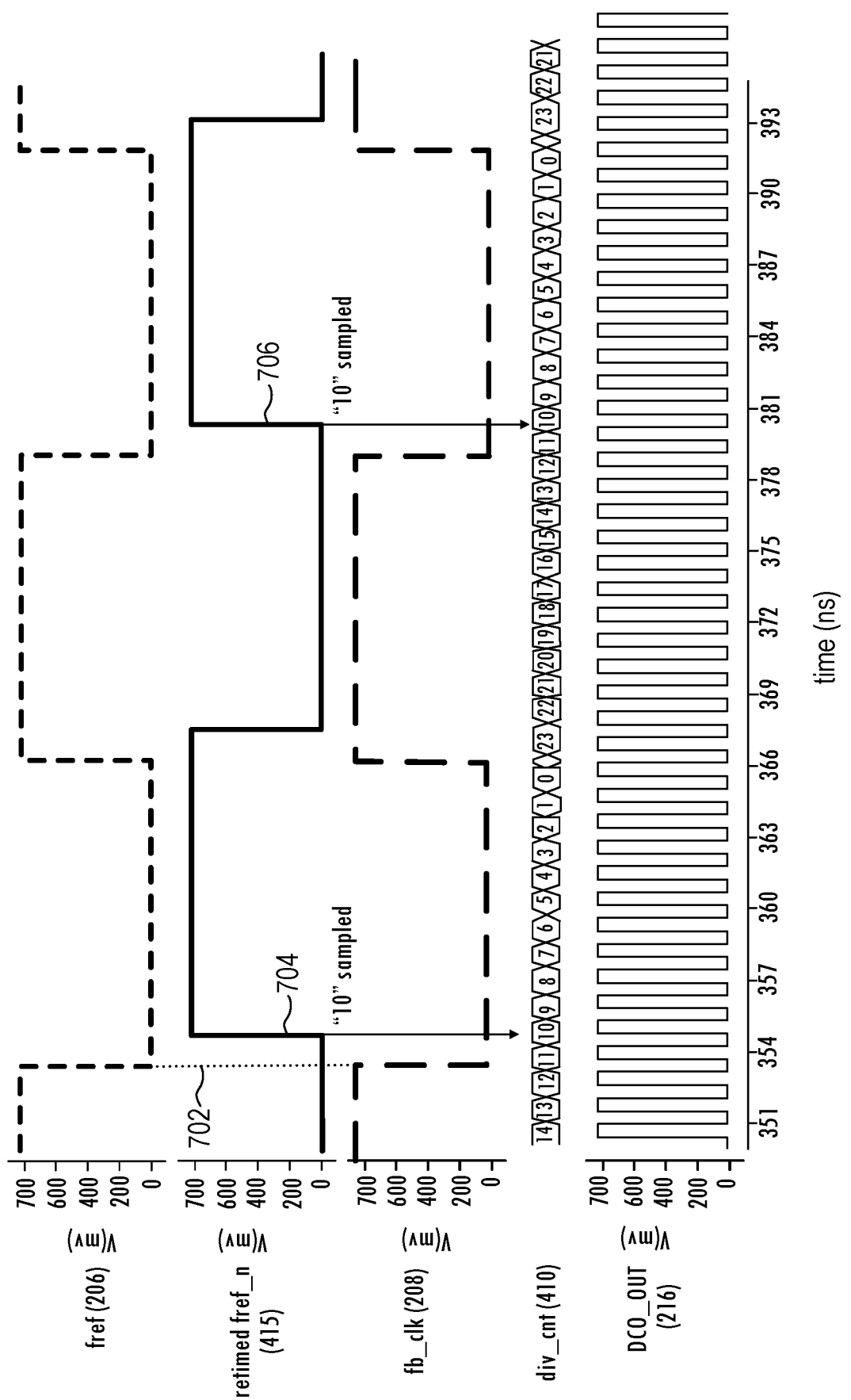

FEEDBACK DIVIDER IN A PLL USED AS A PHASE/FREQUENCY DETECTOR

CROSS-REFERENCE TO RELATED APPLICATION(S)

This application relates to application Ser. No. 18/592,896 filed Mar. 1, 2024, naming Sheng Jue Peh as inventor, and entitled "PLL Using A DCO Period Length Feedback Clock Pulse To Determine Phase Error and TDC Gain", which application is incorporated herein by reference in its entirety.

BACKGROUND

Field of the Invention

This application relates to phase-locked loops (PLLs) and more particularly to frequency and phase detection using a feedback divider.

Description of the Related Art

In digital PLLs, the digital phase detector can have limited range leading to slow locking or even failure to lock. In such PLLs fast lock techniques are typically used to ensure that the PLL eventually locks and does so in a reasonable amount of time. FIG. 1 illustrates a conceptual block diagram of one technique to achieve fast lock. The PLL 100 is a conventional all digital PLL with a time-to-digital converter (TDC) 102 providing a digital phase difference 104 between the reference clock signal (fref) 106 and the feedback clock (fb_clk) signal 108 to the digital loop filter 110. When locked, the feedback clock signal 108 is aligned in phase and frequency to the reference clock signal 106. The digital loop filter 110 supplies a control signal 112 to the digitally controlled oscillator (DCO)/voltage controlled oscillator (VCO). The DCO/VCO 114 generates a DCO_OUT signal 116 that is supplied to the feedback divider 118, which in turn generates the feedback clock 108. In addition, the DCO_OUT signal 116 is supplied to the accumulator 120. The accumulator also receives the fref signal and the accumulator counts the number of DCO_OUT cycles that occur in a reference clock signal. The number of DCO_OUT cycles indicates the frequency of the DCO_OUT signal since the reference clock frequency is known. That number (or a value based on that number) is supplied to the digital loop filter 110, which adjusts the oscillator control signal 112 based on the accumulator value. Normally, when in lock or close to lock, the TDC phase error information is sufficient to allow the PLL to remain in lock. The use of the accumulator avoids the problem of the limited range of the TDC resulting in small adjustments being made to the oscillator control signal potentially leading to a long time to lock or even failure to lock. The need for the accumulator 120 results in more circuitry that is required to run on the high speed DCO_OUT signal and increased power consumption.

SUMMARY OF EMBODIMENTS OF THE INVENTION

Accordingly, embodiments combine the functionality of the accumulator with the feedback divider thereby avoiding the need for extra circuitry for the accumulator. In an embodiment, a phase-locked loop (PLL) includes a phase detector circuit coupled to receive a reference clock signal and a feedback clock signal and generate first phase error information indicative of a phase difference between the reference clock signal and the feedback clock signal. A digital filter is coupled to receive the first phase error information and generate a filter output using the first phase error information, the filter output being used to generate an oscillator control signal. An oscillator is configured to generate an oscillator output signal based, at least in part, on the oscillator control signal. A feedback divider is coupled to the oscillator output signal and generates the feedback clock signal. The feedback divider is sampled to supply frequency error information and second phase error information used to adjust the oscillator control signal.

In another embodiment a method includes generating first phase error information indicative of a phase difference between the reference clock signal and a feedback clock signal in a phase-locked loop (PLL). A loop filter receives the first phase error information and generates an oscillator control signal using, at least in part, the first phase error information. An oscillator receives the oscillator control signal and generates an oscillator output signal. The method further includes generating a feedback divider signal in a feedback divider coupled to the oscillator output signal and sampling the feedback divider to generate frequency error information and second phase error information. The method further includes generating the oscillator control based, at least in part, on at least one of the frequency error information and the second phase error information.

In another embodiment a phase-locked loop (PLL) includes a time to digital converter circuit coupled to receive a reference clock signal and a feedback clock signal and generate first phase error information indicative of a phase difference between the reference clock signal and the feedback clock signal. A digital filter is coupled to receive the first phase error information and generate a filter output using the first phase error information, the filter output being used to generate an oscillator control signal. An oscillator generates an oscillator output signal based, at least in part, on the oscillator control signal. A feedback divider circuit includes a ripple counter coupled to the oscillator output signal and the feedback divider is configured to generate the feedback clock signal. Samples of the ripple counter are used to generate frequency error information and to generate second phase error information and at least one of the second phase error information and the frequency error information is used to generate the oscillator control signal.

BRIEF DESCRIPTION OF THE DRAWINGS

The present invention may be better understood, and its numerous objects, features, and advantages made apparent to those skilled in the art by referencing the accompanying drawings.

FIG. 5 illustrates a timing diagram showing how the count value of the ripple counter provides frequency and phase information that can be used to adjust the frequency of the DCO.

FIG. 7 is a timing diagram showing how the frequency and phase information provided by the ripple counter does not affect the loop filter when the PLL is locked.

The use of the same reference symbols in different drawings indicates similar or identical items.

DETAILED DESCRIPTION

Figure 1:
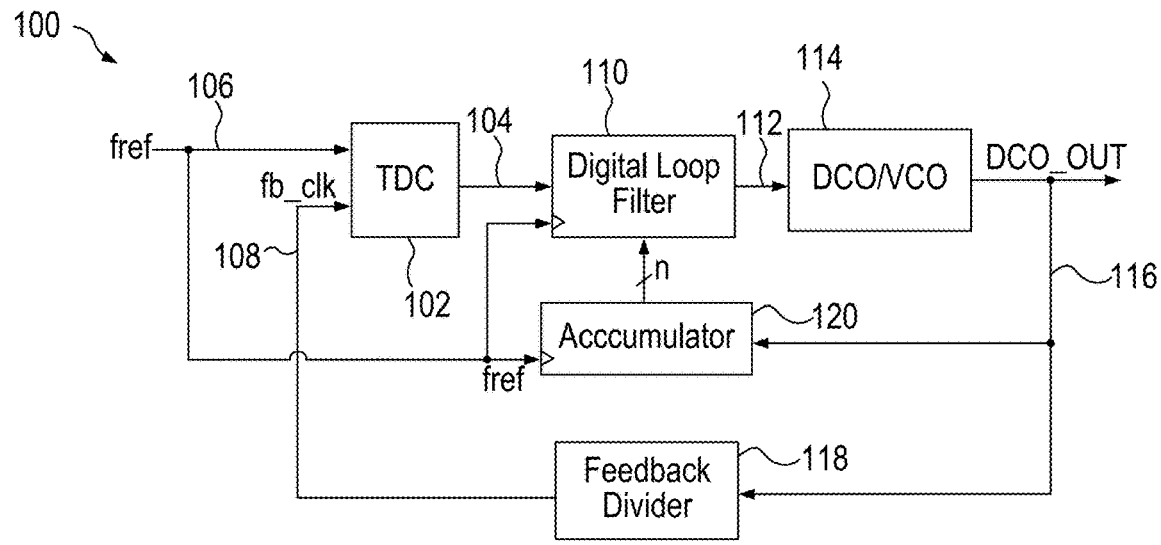
FIG. 1 illustrates a conceptual block diagram of a technique to achieve fast lock using an accumulator running on the oscillator output.
Figure 2:
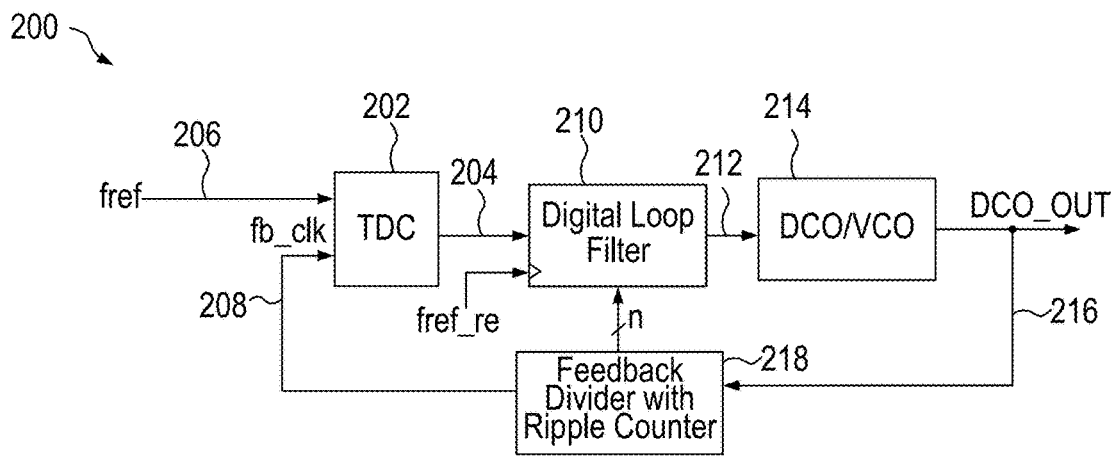
FIG. 2 illustrates a high level block diagram of an embodiment that uses the feedback divider with a ripple counter to provide coarse phase and frequency information to help achieve a faster lock in the PLL.

FIG. 2 illustrates a high level diagram of an embodiment of a PLL that combines the functionality of the accumulator with the feedback divider thereby avoiding the need to have extra circuitry to provide a quicker lock. In addition, the phase/frequency error is scaled nicely to the output frequency, which can make the response of the PLL fully linear. In FIG. 2, the PLL 200 includes a time-to-digital converter (TDC) 202 providing the phase difference 204 between the reference clock signal (fref) 206 and the feedback clock (fb_clk) signal 208 to the digital loop filter 210. The digital loop filter 210 supplies a control signal 212 to the oscillator (DCO/VCO) 214 to control the frequency of the oscillator output signal (DCO_OUT) 216. The DCO/VCO can be implemented in many different ways as is well known to those of skill in the art. In an embodiment the DCO/VCO includes a digital to analog converter to convert the digital signal from the digital loop filter to an analog value to control a conventional LC tank oscillator. In other embodiments, a varactor array is digitally controlled to adjust a frequency of the LC oscillator. Various combinations of digital and analog techniques can be used to tune the oscillator depending on its implementation. In still other embodiments the digital control signal 212 controls a ring oscillator through analog and/or digital mechanisms. For ease of reference, the oscillator 214 will be referred to as DCO 214 regardless of its particular implementation and the oscillator output signal is referred herein as DCO_OUT. The DCO 214 generates the DCO_OUT signal 216 that is supplied to the feedback divider 218, which in turn generates the feedback signal 208. In an embodiment the feedback divider 218 includes a ripple counter. The feedback divider count value provides phase and frequency information used to adjust the control signal 212 as explained further herein. The ripple counter can be implemented as a down counter or an up counter.

Figure 3:
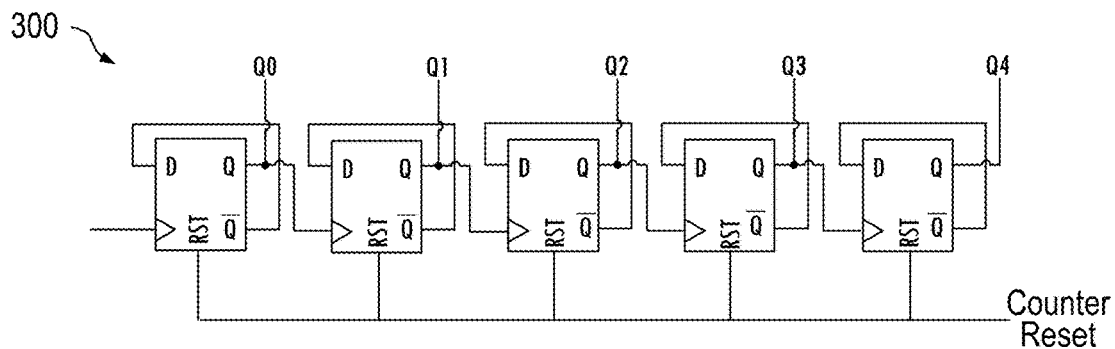
FIG. 3 illustrates an embodiment of a ripple counter.

FIG. 3 illustrates an embodiment of a ripple counter 300 included in feedback divider 222. The ripple counter 300 has a maximum count value of 32 (0 to 31) but can be reset to a desired value when the count value reaches a desired count to achieve a flexible divide value. For example, the ripple counter can be reset when the count value reaches 12 (or any other desired number) assuming the ripple counter is a down counter. Alternatively, the ripple counter can be loaded with a desired count value, e.g., 23 and count down to zero. When the ripple counter is an up counter and starts from 0, the ripple counter is reset when the counter reaches a desired value, e.g., 20 (or any other count desired). Thus, the divide value of the ripple counter is programmable in many different ways as is known to those of skill in the art. Programmability is useful to achieve flexibility in the frequency generated by the oscillator 114 and to provide the ability to implement a fractional-N PLL where the divide value is changed to achieve a desired non-integer frequency. Note that q0 is the least significant bit in the implementation of the ripple counter shown in FIG. 3.

Figure 4A:
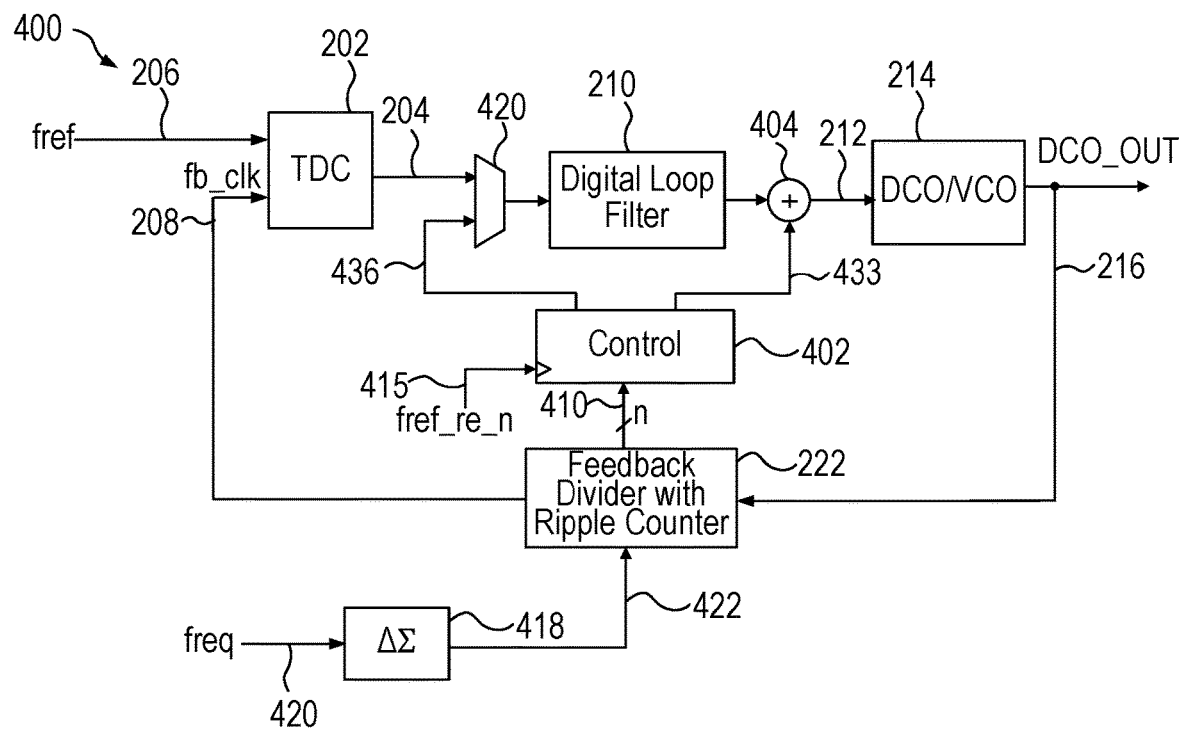
FIG. 4A illustrates a high level block diagram of an embodiment that uses the feedback divider with a ripple counter to provide coarse phase and frequency information to help achieve a faster lock in the PLL.
Figure 4B:
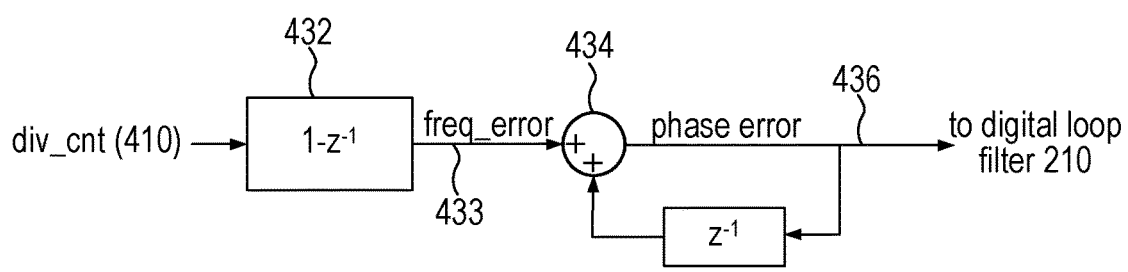
FIG. 4B illustrates how frequency and phase error is determined in an embodiment.

FIG. 4A, 4B, and FIG. 5 illustrate how sampled counter values provide phase and frequency information that can be used to adjust the DCO 214 to more quickly lock the DCO to the desired phase and frequency. FIG. 4A includes the same elements as the PLL shown in FIG. 2 and in addition shows separately control logic 402 whose use is explained in conjunction with FIG. 5. FIG. 5 illustrates various clock signals present in the system of FIG. 4A including the reference clock signal (fref) 206, a retimed fref signal (fref_re_n) 415, which in an embodiment is two DCO_OUT cycles after fref 206 and inverted, the feedback clock (fb_clk) signal 208 and DCO_OUT clock 216. Retiming the fref signal (fref_re_n) 415 ensures synchronization between fref 206 and the DCO_OUT signal 216. As can be seen in FIG. 5, the reference clock signal 206 and the feedback clock signal 208 are not aligned meaning the PLL is not locked. The control logic samples the ripple counter output (div_cnt) 410, i.e., (q<0>:q<4>), using the retimed fref signal.

In the embodiment illustrated in FIG. 5 the divider utilizes the ripple counter as a down counter which counts from 23 to 0 to provide a divide by 24 to generate the feedback clock signal. Note that the feedback clock signal (fb_clk) rising edge occurs responsive to the count value reaching 0 and the falling edge occurs responsive to the count value reaching 12 to provide a 50% duty cycle. Of course, the duty cycle of the feedback clock signal can be adjusted by changing the value of the ripple counter causing the falling edge of the feedback clock. Of course, the rising edge can also be changed by changing to a different count value to cause the rising edge. The edges of the feedback clock signal can be determined according to the count value and SR logic shown in FIG. 6.

While FIG. 5 illustrates an embodiment in which the ripple counter is implemented as a down counter in other embodiments the ripple counter is an up counter counting from 0 to 23 with the reset being asserted when the count value equals 23 (or another desired count value). In still other embodiments the ripple counter counts down from a maximum count value, e.g., 31, to a desired count value, or up from a desired initial count value to the maximum count value. Other approaches to the ripple counter are possible and known to those of skill in the art.

Still referring to FIGS. 4A and 5, the control logic 402 samples the outputs 410 (div_cnt) of the ripple counter at 502 on the rising edge of the retimed fref_n signal. The control logic samples a count value of "1" at 502. The feedback clock rising edge occurs at 504 responsive to the ripple counter counting down to 0. The ripple counter is then reloaded with the desired count value, e.g., 23 and then the ripple counter starts counting down. Loading the ripple counter with the desired value before counting down is well known in the art. For example, preset and clear functionality on D flip-flops can be used to load the desired start value. In one or more embodiments each of the flip-flops is configured to load either a 1 or 0 on assertion of reset according to another signal not shown in FIG. 4A. Other approaches can of course be used according to the particular implementation of the ripple counter. The feedback clock signal falling edge occurs at 506. The control logic 402 then samples the ripple counter on the next rising edge of the retimed fref_n signal at 508. At that time the control logic samples a count value of "2". The difference between the current count value "2" and the previous count value "1" provides the frequency information that can be used to adjust the control signal 212 supplied to the DCO 214. Here because the difference is +1, that indicates the DCO_OUT clock signal is too fast. If the difference were negative, that would indicate the DCO_OUT clock signal is too slow. That frequency information allows the control signal 212 supplied to the DCO 214 to be adjusted by an amount 433 corresponding to the frequency error indicated by the difference between the successive measurements. The frequency error 433 is a constant multiplied by the difference between successive measurements and thus is correlated directly with the DCO output. Thus, a difference of +2 results in an error correction twice that of +1. The constant is stored, e.g., in non-volatile memory and retrieved by control logic 402.

Phase error can be determined from the frequency error that is determined using the output 410 of the ripple counter. To measure the frequency error, embodiments measure the difference between the current and previous values. In Z transform notation, as shown in FIG. 4B, the frequency error 433 is determined as $(1-z^{-1})$ in block 432. Summing up the frequency error successively in summer 434 results in the phase error $(1/(1-z^{-1}))$. The phase error 436 can then be utilized by the digital loop filter 210 in a manner similar to phase error 204 supplied by the TDC. Referring to FIG. 4A, in an embodiment the control logic 402 causes the selector circuit 420 to select the phase error 436 determined from the ripple counter in place of the output 204 from the TDC 202 in situations in which faster lock is desired. When the phase error 436 settles back to zero, the control logic causes the selector circuit to switch back to the TDC output 204.

In an embodiment the frequency error from FIG. 4B may be used alone or with phase error 436 to adjust the control signal 212 provided to the DCO 214. Both frequency error 433 and phase error 436 are multiplied by a gain that is equivalent to the number of TDC delays per DCO period. In an embodiment in which the frequency error 433 is used to help the DCO 214 lock faster, the frequency error 433 is summed with the output of the the digital loop filter 210 in summer 404 to provide an integrator function.

The loop filter 210 in various embodiments provides the desired combination of proportional, integral, and derivative control based on the needs of the particular system. Adjusting the output of the loop filter based on the phase error 436 and/or the frequency error 433 helps reduce the lock time as the error can be more quickly addressed than by waiting for the phase/frequency error information supplied by the TDC to be used to attempt to lock. The appropriate place to incorporate the phase error 436 and/or the frequency error 433 to adjust the DCO control signal 212 depends on the particular implementation of the PLL. When the PLL is locked the difference between successive measurements on the same edge of the sample clock signal is zero and therefore the frequency information from the ripple counter does not affect the use of the much finer phase information from the TDC to maintain lock. For fractional-N operations, there is a chance the difference in the ripple counter samples will be +/-1, and hence to avoid false triggers of phase/frequency error, embodiments only consider successive +/-1 s, or three successive +/-1 s for some embodiments. For wider range multi-modulus dividers, where more false triggers can occur, a wider range of possible false triggers are ignored based on the range of the multi-modulus divider used to achieve the desired frequency in the PLL.

Figure 6:
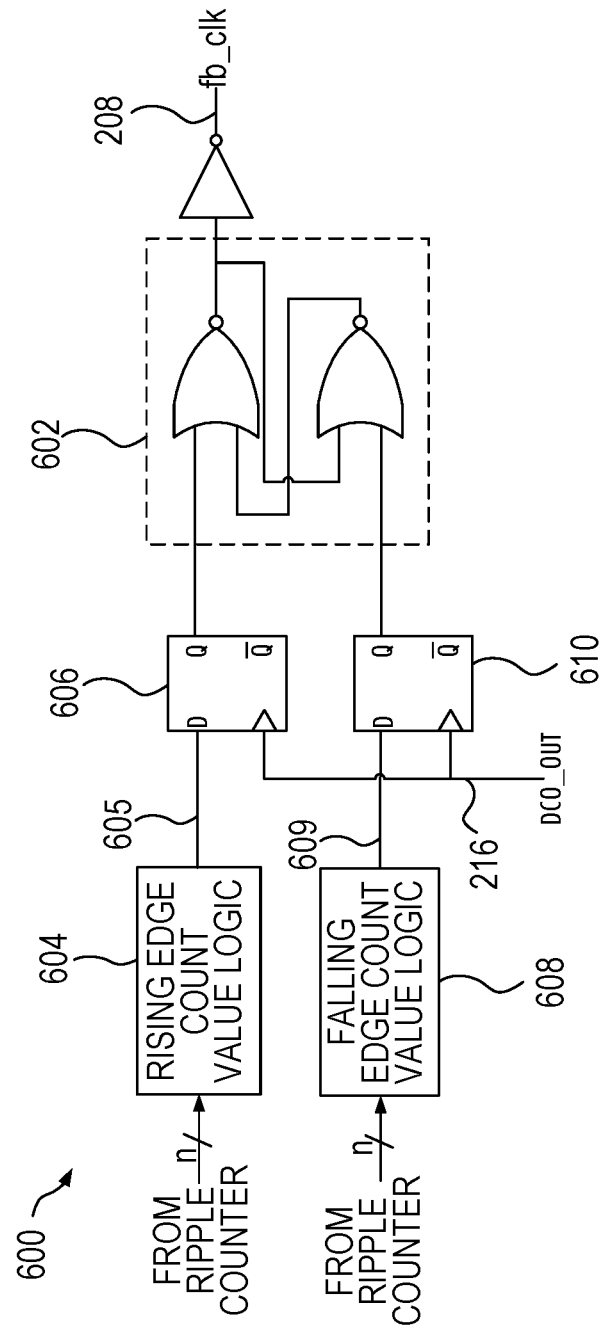
FIG. 6 illustrates an embodiment of feedback clock logic used to provide the rising and falling edges of the feedback clock signal.

In addition to the ripple counter, the feedback divider includes logic to ensure the feedback divider 222 supplies a desired feedback clock signal 208, e.g., with a desired duty cycle, e.g., 50%. FIG. 6 illustrates an example of logic 600 included in an embodiment of the feedback divider to provide the desired feedback clock signal. In an embodiment the logic 600 guarantees a duty cycle closest to 50% rounded to the closest integer after dividing the divide value by 2. For all even divide values that will be 50% but for odd integer values it will be (N+1)/2N or (N-1)/2N, where N is the divide value. For example, a divide by 3 yields a 66% or 33% duty cycle depending on rising/falling edge taken. The logic 600 includes set reset (SR) logic 602, which helps determine the rising and falling edge of the feedback clock 208. Rising edge logic 604 establishes the rising edge of the feedback clock signal. For example, the rising edge of the feedback pulse may occur when the ripple counter value is zero and thus the rising edge logic 604 may be implemented as a simple NOR gate with inputs Q0:Q4. The output 605 of rising edge logic 604 supplies the D input of flip-flop 606, which is clocked by the DCO_OUT clock signal 216 to align the feedback clock signal with DCO_OUT. The falling edge count value logic 608 asserts when the count value of the ripple counter corresponds to the falling edge. For example, in an embodiment the output signal 609 asserts when the count value is halfway to provide a 50% duty cycle feedback clock signal. Falling edge logic 608 may be implemented as a NOR gate with appropriate inputs inverted to correspond to the desired count value. The output 609 of falling edge logic 608 supplies the D input of flip-flop 610, which is clocked by the DCO_OUT clock signal 216 to align the feedback clock signal with DCO_OUT. Of course, other embodiments may provide other duty cycles. In addition, the rising edge may assert on a non-zero count value, e.g., in an implementation that uses a ripple counter as an up counter or that counts down to a desired value other than zero. Regardless of the particular implementation, the count values are used to determine the rising and falling edge of the feedback clock signal.

Referring again to FIG. 5, in addition to frequency information, the value of the ripple counter provides phase information. Instead of requiring a difference between successive measurements, a single sampled value can be used to provide the phase information. For example, assume that if the reference clock (fref) and the feedback clock (fb_clk) are aligned, the sampled value is "n". Assume the feedback divider is a divide by 24, and the sample clock is an inverted version of the reference clock fref delayed by two DCO_OUT cycles and the sample is made on rising edge of retimed fref_n. With those assumptions, the value of the div_cnt sample for a locked PLL should be 10. If the phase is off by one DCO_OUT cycle the count will be 11 or 9 when sampled. Those count values correspond to the phase being off by a DCO_OUT cycle. Of course, other embodiments may sample at a different location but the count value at that location should indicate a locked PLL. The TDC provides much greater phase resolution than 1 DCO cycle but its range, as stated earlier, is limited. If a phase difference of several DCO cycles exists, the control signal is adjusted by a correction amount corresponding to the number of cycles. That correction amount can be stored, e.g., in non-volatile memory and correspond to the sampled count, which is an integer between 0 and 23 depending on the sampling edges and the retimed fref signal.

Referring back to FIG. 4A, in the illustrated embodiment a delta sigma modulator 418 controls the feedback divider. The delta sigma modulator receives the desired frequency (freq) 420 and the divide value of the ripple counter changes in accordance with divide control signal 422 supplied by the delta sigma modulator. The change in the divide value of the ripple counter should occur to ensure there are no unexpected perturbations in the feedback clock signal. For example, the new divide value should be "ready" in an embodiment before the count reaches the end of the current divide (indicated by a count value of 0 in FIG. 5) so the new count value can be loaded on reset. More generally, the new divide value should be "ready" any time before the next cycle where the feedback divider has to count up/down to/from the new value.

In embodiments, the divider counts on the negative edge of the DCO clock and the sampling occurs on the positive edge of the retimed fref clock signal fref_re_n. Various timing schemes can be utilized depending on the particular implementation and hardware capabilities. The timing should be synchronized to ensure that the phase information from the TDC 202 and the phase and frequency correction information 403 based on the ripple counter count value describes the same edge of the feedback clock signal. Thus, in the embodiment illustrated in FIG. 4A, the correction amount 403 and the filter output signal 411 should describe the same edge of the feedback clock signal. In an embodiment, the output of the ripple counter has a delay of only one flip-flop from the DCO output to ensure the ripple counter is sampled at a good time.

While the approach described herein to use the ripple counter values to provide coarse phase information and frequency information to the loop filter is particularly useful during startup as the PLL tries to initially lock to the desired output frequency, the ripple counter values can also be used when the PLL loses lock due to, e.g., a supply voltage glitch, to more quickly bring the PLL back into lock, or when the PLL tries to lock to a different frequency. While the control logic in FIG. 4A is shown as a separate block, the control logic may be incorporated in whole or in part into the loop filter or other control logic associated with the PLL.

FIG. 7 illustrates the system when the PLL is locked. That is, fref 206 and the fb_clk signal are aligned at 702. The control logic samples the ripple counter at 704 and 706 and retrieves the counter value of "10", which is the counter value sampled when the PLL is locked. Thus, the phase information from the counter indicates a locked condition and the frequency information also indicates the frequency of the feedback clock signal and the reference clock is the same since both samples of the ripple counter have the same value. Thus, the phase and frequency information from the counter does not affect the digital loop filter when the PLL is locked.

Thus, a PLL providing coarse phase/frequency information from the feedback divider has been described. The description of the invention set forth herein is illustrative and is not intended to limit the scope of the invention as set forth in the following claims. The terms "first," "second," "third," and so forth, as used in the claims, unless otherwise clear by context, is to distinguish between different items in the claims and do not otherwise indicate or imply any order in time, location, or quality. For example, "first phase information," and "second phase information," does not indicate or imply that the first phase information occurs in time before the second phase information. Variations and modifications of the embodiments disclosed herein may be made based on the description set forth herein, without departing from the scope of the invention as set forth in the following claims.

What is claimed is:

1. A phase-locked loop (PLL) comprising:
   a phase detector circuit coupled to receive a reference clock signal and a feedback clock signal and generate first phase error information indicative of a phase difference between the reference clock signal and the feedback clock signal;
   a digital filter coupled to receive the first phase error information and generate a filter output using the first phase error information, the filter output being used to generate an oscillator control signal;
   an oscillator configured to generate an oscillator output signal based, at least in part, on the oscillator control signal;
   a feedback divider coupled to the oscillator output signal and configured to generate the feedback clock signal; and
   control logic to sample the feedback divider to generate frequency error information based on a difference between samples of the feedback divider, the frequency error information being combined with the filter output to thereby adjust the oscillator control signal.

2. The PLL as recited in claim 1 further comprising a summing circuit to combine the frequency error information and the filter output.

3. The PLL as recited in claim 1 wherein the feedback divider comprises a ripple counter.

4. The PLL as recited in claim 3 wherein second phase error information is generated using the frequency error information and the second phase error information is more coarse than the first phase error information.

5. The PLL as recited in claim 3 wherein a retimed reference clock signal is used to sample the ripple counter.

6. The PLL as recited in claim 4 further comprising:
   a selector circuit to supply the digital filter with either the first phase error information or the second phase error information.

7. The PLL as recited in claim 3 wherein a difference between a first sampled value of the ripple counter and a second sampled value of the ripple counter is indicative of the frequency error information.

8. The PLL as recited in claim 7 wherein the oscillator control signal is adjusted based on the difference.

9. The PLL as recited in claim 3 wherein a divide value of the ripple counter is programmable.

10. The PLL as recited in claim 3 wherein the frequency error information is used to provide faster lock.

11. A method comprising:
    generating first phase error information indicative of a phase difference between a reference clock signal and a feedback clock signal in a phase-locked loop (PLL);
    supplying the first phase error information or second phase error information through a selector circuit to a loop filter and generating a loop filter output signal from the loop filter;
    generating an oscillator control signal using, at least in part, the loop filter output signal;
    receiving the oscillator control signal at an oscillator and generating an oscillator output signal; and
    generating a feedback divider signal in a feedback divider that is coupled to the oscillator output signal;
    sampling the feedback divider to generate frequency error information based on a difference between samples of the feedback divider;
    generating the second phase error information using the frequency error information; and
    generating the oscillator control signal by combining the frequency error information—and the loop filter output signal.

12. The method as recited in claim 11 further comprising using a ripple counter in the feedback divider.

13. The method as recited in claim 12 further comprising retiming and negating the reference clock signal to generate a retimed reference clock signal and using the retimed reference clock signal to sample the ripple counter to generate the frequency error information.

14. The method as recited in claim 13 further comprising generating the second phase error information by summing the frequency error information.

15. The method as recited in claim 14 further comprising:
determining the frequency error information according to a difference between successive samples of the ripple counter.

16. The method as recited in claim 15 further comprising taking a first sample of the ripple counter with a first edge of the retimed reference clock signal and taking a second sample with a second edge of the retimed reference clock signal.

17. The method as recited in claim 11 further comprising using the frequency error information to provide faster lock when the PLL is locking to the reference clock signal as compared to not using the frequency error information.

18. A phase-locked loop (PLL) comprising:
a time to digital converter circuit coupled to receive a reference clock signal and a feedback clock signal and generate first phase error information indicative of a phase difference between the reference clock signal and the feedback clock signal;
a selector circuit to supply the first phase error information or second phase error information;
a loop filter coupled to the selector circuit receive the first phase error information or the second phase error information and generate a loop filter output, the loop filter output being used to generate, an oscillator control signal;
an oscillator configured to generate an oscillator output signal based, at least in part, on the oscillator control signal;
a feedback divider circuit including a ripple counter coupled to the oscillator output signal and configured to generate the feedback clock signal;
control logic to sample the ripple counter and to generate frequency error information based on a difference between samples of the ripple counter and to generate the second phase error information using the frequency error information; and
a summing circuit to sum the frequency error information with the loop filter output to generate the oscillator control signal.

19. The PLL as recited in claim 18 wherein the ripple counter is sampled with a retimed version of the reference clock signal.

20. The method as recited in claim 11 further comprising combining the frequency error information and the loop filter output signal by summing the frequency error information and the loop filter output signal.

* * * * *